(12) United States Patent
Smith et al.

(10) Patent No.: US 6,512,472 B1
(45) Date of Patent: Jan. 28, 2003

(54) METHOD AND APPARATUS FOR OPTIMIZING DYNAMIC RANGE OF A WIDEBAND ANALOG-TO-DIGITAL CONVERTER

(75) Inventors: Patrick D. Smith, Deerfield, IL (US); William C. Hart, Huntley, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/047,959

(22) Filed: Jan. 15, 2002

(51) Int. Cl.$^7$ ................................................ H03M 1/12
(52) U.S. Cl. ........................................................ 341/155
(58) Field of Search ................................. 341/155, 156, 341/143, 139, 122; 348/11, 194, 726, 678, 672; 375/345; 455/339, 552, 355

(56) References Cited

U.S. PATENT DOCUMENTS

| | | | | |
|---|---|---|---|---|
| 5,933,200 A | * | 8/1999 | Han | 348/725 |
| 6,133,964 A | * | 10/2000 | Han | 348/726 |
| 6,169,569 B1 | * | 1/2001 | Widmer et al. | 348/11 |
| 6,236,726 B1 | * | 5/2001 | Darveau | 379/417 |
| 6,295,316 B1 | * | 9/2001 | Tonami et al. | 375/230 |
| 2001/0036838 A1 | * | 11/2001 | Higuchi | 455/552 |

* cited by examiner

*Primary Examiner*—Brian Young
*Assistant Examiner*—John Nguyen
(74) *Attorney, Agent, or Firm*—Mayer, Fox, Kort & William; Karin L. Williams, Es

(57) ABSTRACT

A direct down conversion receiver includes a signal filter having a selectable frequency response for receiving an input signal. The filtered signal is amplified by a variable gain amplifier, and the amplified signal is received as input by an analog-to-digital converter. The analog-to-digital converter generates a series of digital samples representative of the filtered signal. A controller measures a corresponding peaking ratio of the filtered signal from the series of digital samples for each of a plurality of frequency bands and selects the frequency response of the signal filter as a function of the measured peaking ratios. The signal filter may include an adjustable highpass filter and an adjustable lowpass filter. The cutoff frequency of the lowpass filter and the cutoff frequency of the highpass filter are selected to attenuate the level of the input signal in one or more of the plurality of frequency bands so that the signal presented to the analog-to-digital converter has a peaking ratio approximately equal to a selected peaking ratio threshold across the frequency range of the input signal.

31 Claims, 9 Drawing Sheets

METHOD AND APPARATUS FOR OPTIMIZING DYNAMIC RANGE OF A WIDEBAND ANALOG-TO-DIGITAL CONVERTER

FIELD OF THE INVENTION

The present invention relates generally to digital communications receivers. More specifically, but without limitation thereto, the present invention relates to adjusting the gain of a communications signal in selected frequency bands of a system frequency range.

BACKGROUND OF THE INVENTION

The performance of analog-to-digital converters in digital communications receivers has progressed to the point where sampling speeds are sufficient to accommodate a communications signal carrying information on multiple carriers with a single analog-to-digital converter. After the multiple-carrier signal is sampled by the analog-to-digital converter, the digitized samples from the analog-to-digital converter are digitally demodulated to recover the information from each of the multiple carriers. The demodulator throughput may be increased by presenting the digitized samples from the analog-to-digital converter in a time-multiplexed format according to a Quality of Service (QoS) prioritization, or by implementing multiple demodulators to demodulate each of the multiple carriers concurrently. However, the advantages of a single analog-to-digital converter at the front end of a digital receiver have been offset by the difficulties encountered in the wideband multiple-carrier environment.

The dynamic range of an analog-to-digital converter is fixed by the number of bits of precision, while the dynamic range of a wideband multiple-carrier signal may vary with hardware configuration and environmental conditions, frequently exceeding the dynamic range of the analog-to-digital converter. Signals that exceed the dynamic range of the analog-to-digital converter result in clipping. For example, if an eight-bit analog-to-digital converter has an input voltage range of −0.5 volts to +0.5 volts, then there are 256 digital samples equally distributed between −0.5 volts and +0.5 volts that may be generated before the analog-to-digital converter exhibits clipping distortion. When clipping occurs, the analog-to-digital converter generates full-scale codes representing the full-scale input voltage for as long a time as the input signal voltage exceeds the full-scale input voltage of the analog-to-digital converter. Even though a desired signal may be well below the full-scale input voltage of the analog-to-digital converter, an interfering signal that exceeds the full-scale input voltage of the analog-to-digital converter could block the desired signal, even if the interfering signal is in a different frequency band, if both the desired signal and the interfering signal are in the passband presented to the analog-to-digital converter. The blocking of the desired signal results in partial or total service outages that may only be resolved by re-aligning the input signal levels below the full-scale input voltage of the analog-to-digital converter. The following are examples of some of the problems and limitations in a multi-carrier system:

1) The carriers may not all have the same signal level. The maximum signal level cannot exceed the full-scale input voltage of the analog-to-digital converter, and the minimum signal level must exceed the noise level of the analog-to-digital converter by a minimum signal-to-noise ratio to avoid losing or degrading the full bandwidth system performance.

2) The carriers may not all be of the same type. For example, QPSK, 16QAM, and 64QAM Data Over Cable Service Interface Specification (DOCSIS) carriers may all be present within the bandwidth presented to the analog-to-digital converter. Each of these carrier types has a separate minimum signal-to-noise requirement that must be maintained to preserve full bandwidth system performance.

3) Other services may also be present that are outside control of the Data Over Cable Service Interface Specification ranging protocol in the desired bandwidth, for example, video carriers may exist with the QPSK, 16QAM, and 64QAM DOCSIS carriers. The signals generated by the other services are independent of the DOCSIS ranging protocol and may result in a combined signal that exceeds the full-scale input of the analog-to-digital converter unless some type of filtering prior to analog-to-digital conversion is performed.

4) Spurious interference, including ingress signals, i.e., signals inserted into the distribution network by unsupported equipment, are outside of the overall link's system control. Ingress signals may require the placement of permanent filtering at certain points of a system, which may not readily be performed or changed without field service calls.

5) Interference filters may be placed at the input of the receivers, but these filters are expensive and bulky, and plant specific ingress signals and service types present difficulties in optimizing such filters without some amount of trial and error. Also, readjustments may have to be performed as the system configuration changes over time.

6) Cable television plant levels are subject to variation resulting from changes in temperature due to weather and from changes in circuit components due to aging. Each plant therefore requires some amount of trial and error adjustment to align signal levels optimally.

7) The dynamic range of the analog-to-digital converter may be increased by adding bits of precision, however the cost of adding bits increases exponentially, and power consumption increases about four times for each bit of added precision.

The bandwidth of a received signal is typically limited by a superheterodyne receiver architecture, in which the intermediate frequency (IF) bandwidth is fixed. The superheterodyne architecture is reliable, however the fixed intermediate frequency bandwidth lacks flexibility in optimizing the bandwidth to the individual level requirements of a multi-carrier system. The superheterodyne receiver architecture may be extended to multiple switched intermediate frequency bandwidths to optimize the bandwidth presented to the analog-to-digital converter, however, this approach requires extensive circuitry for local oscillators, switch isolation, separate phase-locked loop (PLL) bandwidths for lock times, phase noise tradeoffs, as well as the intermediate frequency filters themselves. The increased printed circuit board size and cost of such receivers renders them impractical for competitive cost applications.

Direct down conversion receivers have a direct-conversion mixer that eliminates the extra intermediate frequency filters, local oscillators, and the IF down converter in conventional superheterodyne receivers. However, conventional direct down conversion receivers typically control the level of a composite multi-channel signal presented to an analog-to-digital converter by automatic gain control, disadvantageously reducing desired low-level signals below the signal level needed for demodulation to accommodate the limitations of the analog-to-digital converter imposed by other system signals that have a higher signal level and that lie in a frequency band outside that of the desired low-level signals.

DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

In one aspect of the present invention, a direct down conversion receiver includes a signal filter having a selectable frequency response for receiving an input signal. The filtered signal is amplified by a variable gain amplifier, and the amplified signal is received as input by an analog-to-digital converter. The analog-to-digital converter generates a series of digital samples representative of the filtered signal. A controller measures a corresponding peaking ratio of the filtered signal from the series of digital samples for each of a plurality of frequency bands and selects the frequency response of the signal filter as a function of the measured peaking ratios. In one embodiment of the invention, the signal filter includes an adjustable highpass filter and an adjustable lowpass filter. The cutoff frequency of the lowpass filter and the cutoff frequency of the highpass filter are selected to attenuate the level of the input signal in one or more of the plurality of frequency bands so that the signal presented to the analog-to-digital converter has a peaking ratio approximately equal to a selected peaking ratio threshold across the frequency range of the input signal.

Figure 1:
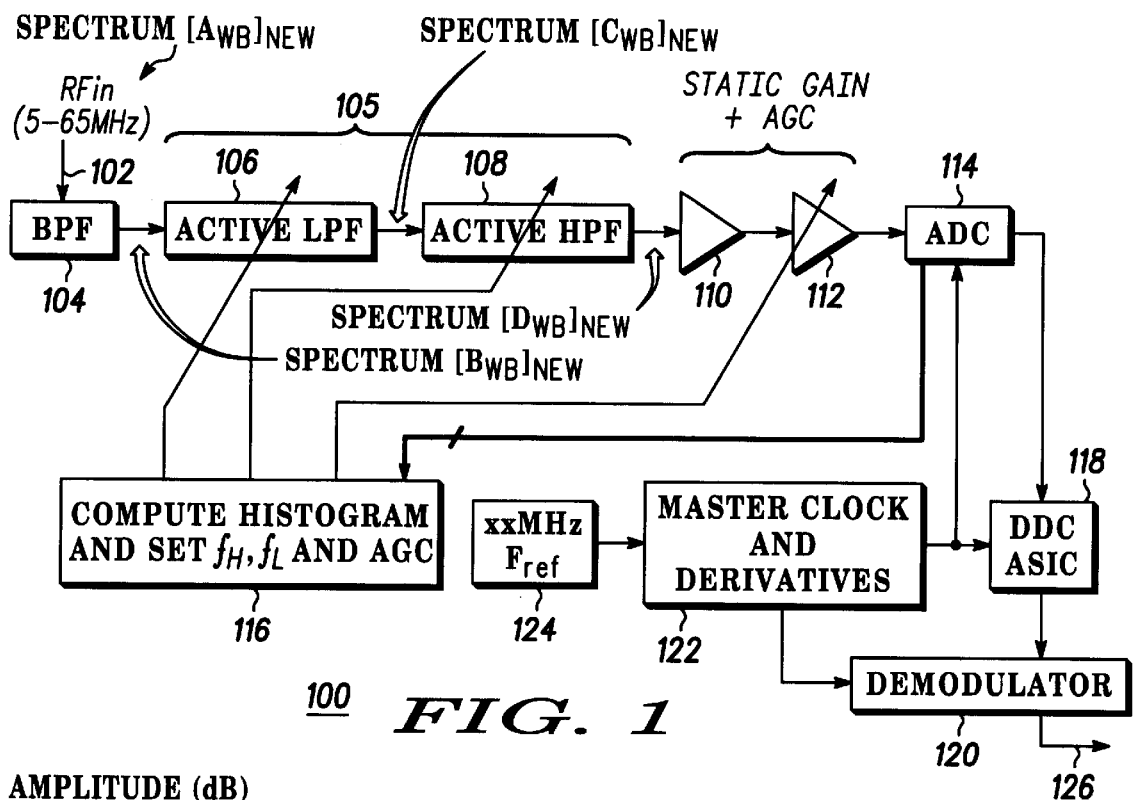
FIG. 1 illustrates a block diagram of a direct down conversion receiver incorporating a wideband analog-to-digital converter with optimized dynamic range according to an embodiment of the present invention.

FIG. 1 illustrates a block diagram of a direct down conversion receiver 100 incorporating a wideband analog-to-digital converter with optimized dynamic range according to an embodiment of the present invention. Shown in FIG. 1 are a signal input 102, a bandpass filter 104, a signal filter 105 comprising an adjustable lowpass filter 106 and an adjustable highpass filter 108, an amplifier 110, a variable gain amplifier 112, an analog-to-digital converter 114, a controller 116, a direct down conversion application specific integrated circuit (ASIC) 118, a demodulator 120, a clock generator 122, a frequency reference 124, and recovered data 126.

The bandpass filter 104, the amplifier 110, the variable gain amplifier 112, the analog-to-digital converter 114, the direct down conversion application specific integrated circuit (ASIC) 118, the demodulator 120, the clock generator 122, and the frequency reference 124 may be made and connected according to well known techniques in the design of direct down conversion receivers. The signal filter 105 may alternatively be made of various combinations of one or more filters including lowpass, highpass, bandpass, and bandstop filters that may be connected in series, in parallel, and various combinations of series and parallel connections. One or more of the filters in the signal filter 105 may have a selectable frequency and/or a selectable gain. In the example of FIG. 1, an adjustable lowpass filter 106 is connected in series with an adjustable highpass filter 108. The adjustable lowpass filter 106 and the adjustable highpass filter 108 each have a selectable cutoff frequency. Only one adjustable lowpass filter 106 and one adjustable highpass filter 108 are shown for purposes of illustration, however, multiple adjustable lowpass filters 106 and adjustable highpass filters 108 may also be used in other embodiments to practice the present invention, The controller 116 may be, for example, a microprocessor connected to the analog-to-digital converter 114, the signal filter 105, and the variable gain amplifier 112.

In operation, the bandpass filter 104 receives an input signal having a system frequency range, such as a multi-carrier signal, from the signal input 102. The bandpass filter 104 attenuates signals outside the system frequency range.

The cutoff frequencies of the adjustable lowpass filter 106 and the adjustable highpass filter 108 are initially selected, for example, to include the entire system frequency range. The amplifier 110 and the variable gain amplifier 112 adjust the level of the signal presented to the analog-to-digital converter 114 to a selected threshold level, typically about 3 dB, below the full-scale range of the analog-to-digital converter 114. The analog-to-digital converter 114 generates a series of digital samples representative of the input signal.

The controller 116 receives the series of digital samples, or some subset thereof, from the analog-to-digital converter 114 and generates a record of the number of analog-to-digital codes generated to represent the analog input waveform for each possible analog-to-digital code over a selected time period. This technique of representing data by sorting the data into categories or bins versus the number of samples corresponding to each bin over a specific value of another variable such as time is called a histogram. The controller 116 selects the cutoff frequencies of the signal filter 105 and the gain of the variable gain amplifier 112 to achieve the desired signal level at each frequency band of the system spectrum. For example, the cutoff frequencies of the adjustable lowpass filter 106 and the adjustable highpass filter 108 may be adjusted to exclude strong undesired signals, such as ingress signals, to avoid clipping of signals by the analog-to-digital converter 114.

The controller 116 may accept manual cutoff frequency inputs, for example, to adapt the direct conversion receiver to a specific cable television (CATV) plant. Alternatively, the controller 116 may operate automatically to adapt to changing conditions, such as ingress signals and variations in distribution amplifier gain, thereby avoiding field maintenance calls and filter replacement.

The direct down conversion application specific integrated circuit (ASIC) 116 may be, for example, a digital signal processing ASIC made according to well known techniques that performs the necessary frequency conversion of a specific desired carrier signal embedded in a digital domain representation of a system of multi-channel signals to a baseband frequency. The baseband signal is then typically digitally pulse shaped and phase de-rotated prior to being delivered to the demodulator 120. The demodulator 120 recovers and generates as output the demodulated data 126. The frequency reference 124 provides a stable frequency standard for the clock generator 122. The clock generator 122 provides the master clock and clock derivatives used to synchronize the demodulator 120, the direct down conversion ASIC 118, and the analog-to-digital converter 114 to each other. Other designs for a direct digital down converter may be used to practice the invention according to techniques well known in the art.

Figure 2:
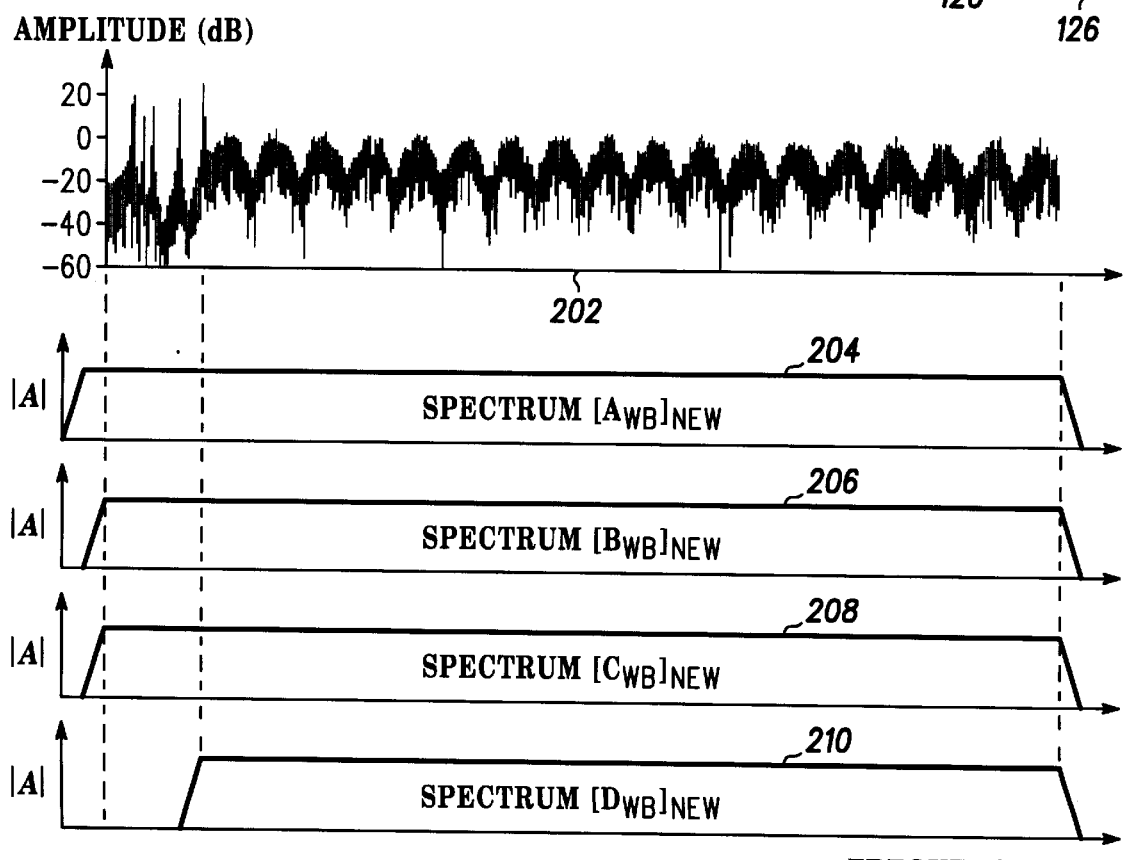
FIG. 2 illustrates a series of spectral plots for a typical multi-carrier system at various points in the direct down conversion receiver of FIG. 1.

FIG. 2 illustrates a series of frequency bandwidth plots for a typical multi-carrier system at various points in the direct down conversion receiver of FIG. 1. Plot 202 illustrates an exemplary system spectrum of an input signal containing five continuous wave (CW) ingress signals and 18 16-quadrature amplitude modulated (16QAM) carriers. As shown in plot 202, the amplitude of the Continuous-wave (CW) signals is more than 20 dB higher than the amplitude of the 16QAM carriers.

Plot 204 illustrates the bandwidth of the input signal received at the signal input 102, which is identical to the bandwidth of the system spectrum illustrated in plot 202.

Plot 206 illustrates the bandwidth of the bandpass filtered signal generated as output by the bandpass filter 104. Because the bandpass filter 104 attenuates signals outside of the frequency range of the system spectrum, the bandwidth of the bandpass filtered signal is the same as that of the system spectrum in plot 204.

Plot 208 illustrates the bandwidth of the lowpass filtered signal generated as output by the adjustable lowpass filter 106. Because there are no interfering signals at the upper end of the system spectrum in this example, the upper frequency limit of the adjustable lowpass filter 106 is not reduced, consequently the bandwidth of the output signal is still substantially the same as that shown in plot 206.

Plot 210 illustrates the bandwidth of the highpass filtered signal generated as output by the adjustable highpass filter 108. The lower frequency limit of the adjustable highpass filter 108 is selected to attenuate the amplitudes of the ingress signals at the low end of the frequency range of the system spectrum shown in plot 202. Multiple adjustable lowpass filters 106 and adjustable highpass filters 108 (not shown) may also be used to provide additional attenuation in one or more frequency bands in the system frequency range.

Figure 3:
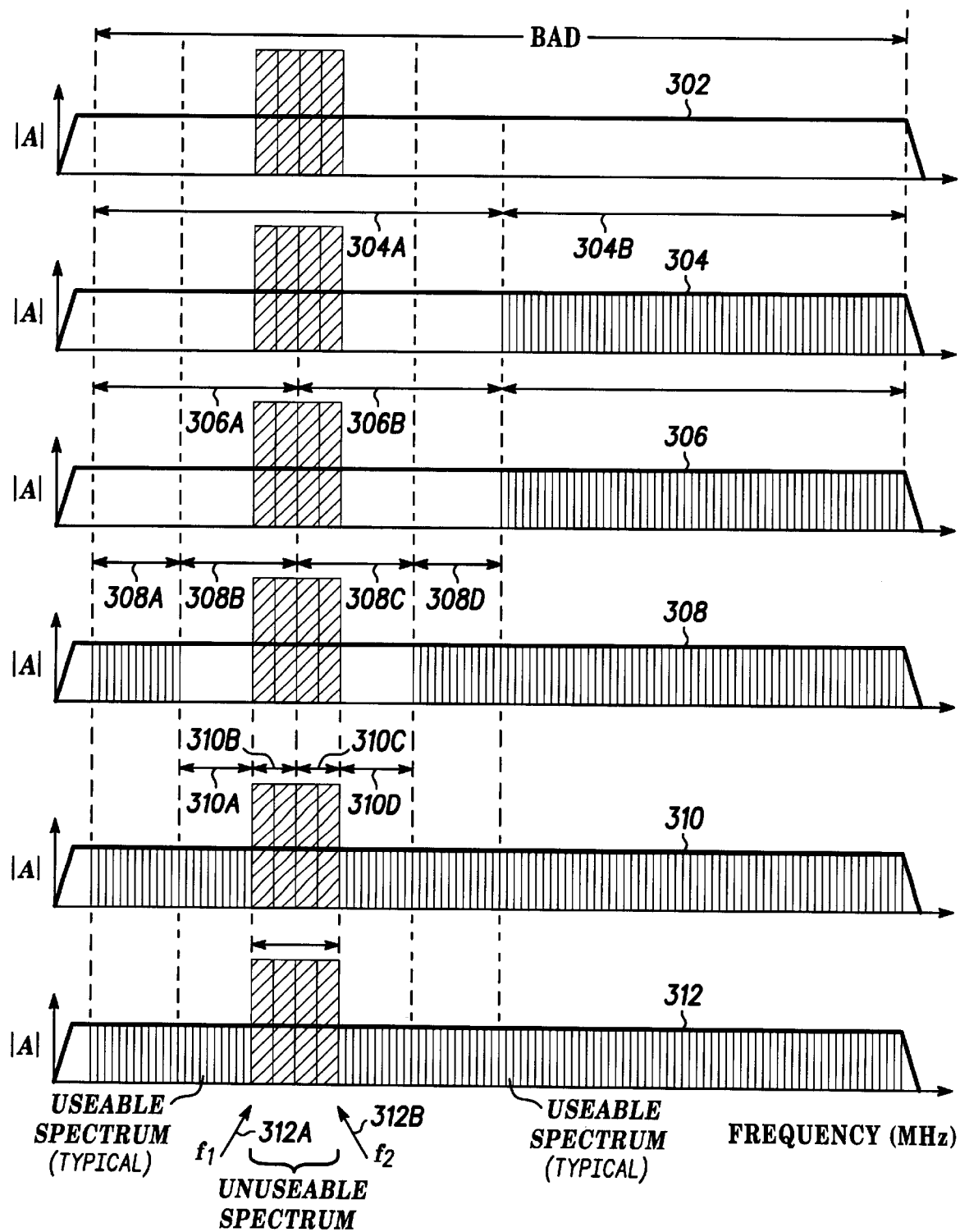
FIG. 3 illustrates a series of spectral plots illustrating a binary search algorithm for peaking identification across associated system level spectra for the direct down conversion receiver of FIG. 1.

The controller 116 may use a variety of techniques to select the cutoff frequencies of the signal filter 105, one of which is illustrated in FIG. 3.

FIG. 3 illustrates a series of spectral plots illustrating a binary search algorithm for peaking identification across associated system level spectra for the direct down conversion receiver of FIG. 1. In plot 302, the entire system frequency range is initially declared "bad", that is, clipping would result if no adjustments are made to the signal filter 105.

In Plot 304, the system frequency range is divided into halves 304A and 304B. The controller 116 again checks each half 304A and 304B to detect clipping. the upper half of the system frequency range is declared "good" and the lower frequency range is declared "bad" by the controller 116 based on the histogram data.

In plot 306, the "bad" half of the system frequency range is again divided into halves 306A and 306B. In this instance, clipping is detected in both halves 306A and 306B. Both halves 306A and 306B are declared "bad" by the controller 116.

In plot 308, each of halves 306A and 306B is further divided into portions 308A, 308B, 308C, and 308D, and the controller 116 declares portions 308B and 308C to be "bad" based on the histogram data.

In plot 310, portions 308B and 308C are further divided into portions 310A, 310B, 310C, and 310D. Portions 308B and 308C are found "bad", while portions 310A and 310D are found "good" by the controller 116. The process of further dividing the frequency bands may be repeated up to the resolution of the frequency selectivity of the bandpass response. In this example, the frequency selectivity is a superposition of the frequency responses of the lowpass 106 and the highpass filter 108.

In plot 312, the low frequency end of the lowest frequency "bad" region 312A and the upper frequency end of the highest frequency "bad" region 312B are identified and received as input by the controller 116 to set the cutoff frequencies of the lowpass filter 106 and the highpass filter 108, respectively.

The gain may be varied in the lineup to compensate for halving the bandwidth, i.e. it may be possible to split one "bad" band and get two "good" bands just by virtue of cutting the bandwidth in half.

Figure 3A:
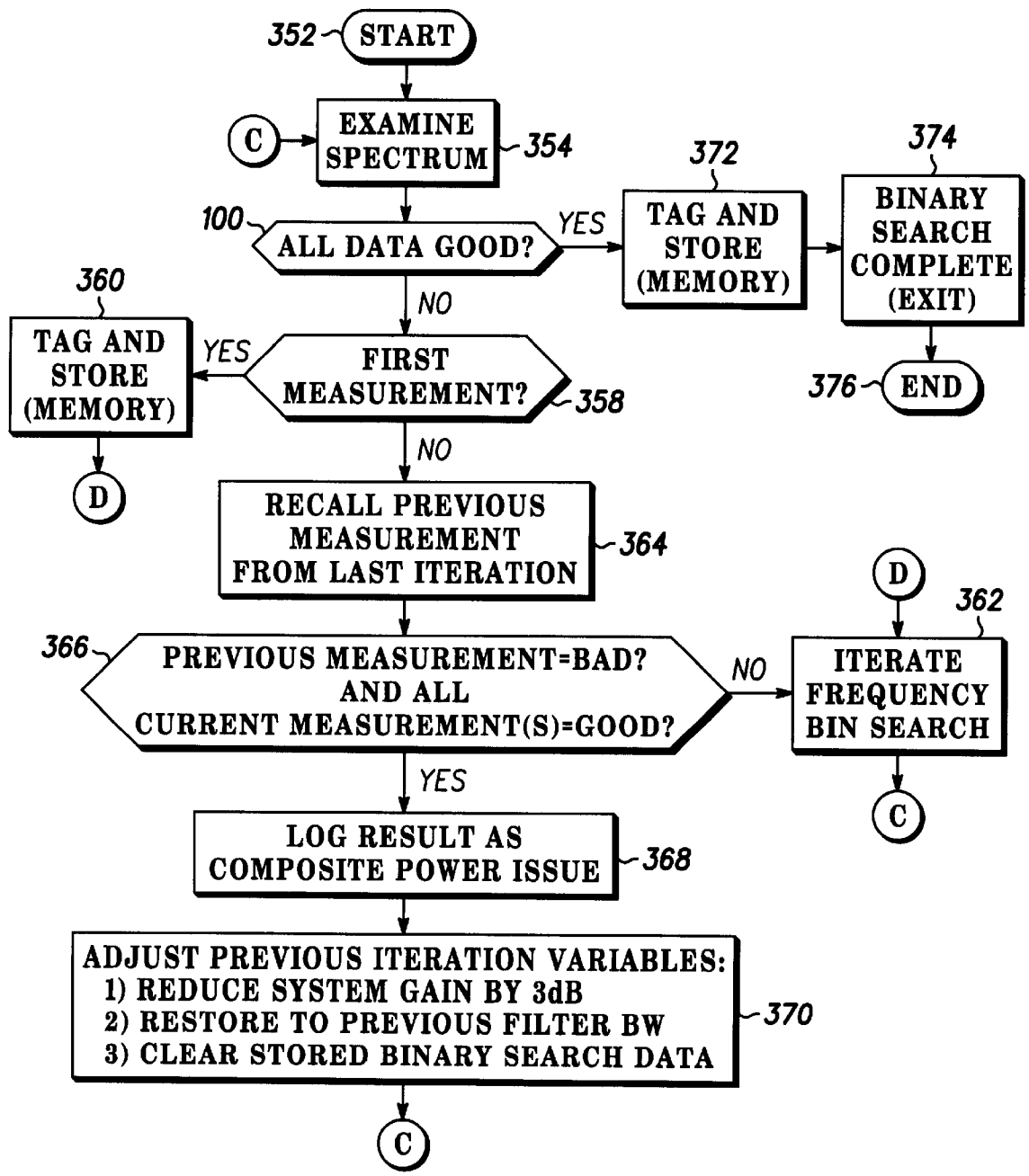
FIG. 3A illustrates a flowchart of a binary search algorithm for compensating halving the bandwidth.

FIG. 3A illustrates a flowchart 300 of a binary search algorithm for compensating halving the bandwidth. The flowchart 300 may be implemented in such a way to compensate prior to measurements of peaking by pre-adjusting the system gain up by 3 dB, or adjusting the $P_O$ up by the same factor, for each halving of the spectral coverage to maintain the relative comparisons of peaking events as the bandwidths contract or increase the same.

Step 352 is the entry point of the flowchart 300.

In step 354, the spectrum is measured to determine the "good" and "bad" portions.

In step 356, if the measurement data is "good", then control transfers to step 372. Otherwise, control transfers to step 358.

In step 358, if the first measurement is being performed, control transfers to step 360. Otherwise, control transfers to step 364.

In step 360, the binary search data is tagged and stored in memory.

In step 362, the frequency binary search is iterated, and control transfers back to step 354.

In step 364, the measurement from the last frequency iteration is recalled.

In step 366, if the previous measurement was "bad", and all current measurements are "good", then control transfers to step 368. Otherwise, control transfers to step 362.

In step 368, the result of the measurement is logged as a composite power issue.

In step 370, the variables of the previous iteration are adjusted as follows:

1) the system gain is reduced by 3 dB;
2) the previous filter bandwidth is restored; and
3) the stored binary search data is cleared from memory. Control then transfers to step 362.

In step 372, the binary search data is tagged and stored in memory.

In step 374, the binary search is terminated.

Step 376 is the exit point of the flowchart 300.

The method illustrated in the flowchart 300 of FIG. 3A may be used to attenuate excessive signal levels or to isolate interference such as ingress signals in each frequency band of the system frequency range. While only one portion of the system frequency range is shown as unusable in this example, the method illustrated in FIG. 3A may be used to find multiple usable and unusable portions as well. The controller 116 can then select the cutoff frequencies of the signal filter 105 to maximize signal-to-noise ratio for the desired carriers of the multi-channel system at the input of the analog-to-digital converter 114 across the system frequency range without inducing clipping.

Figure 4:
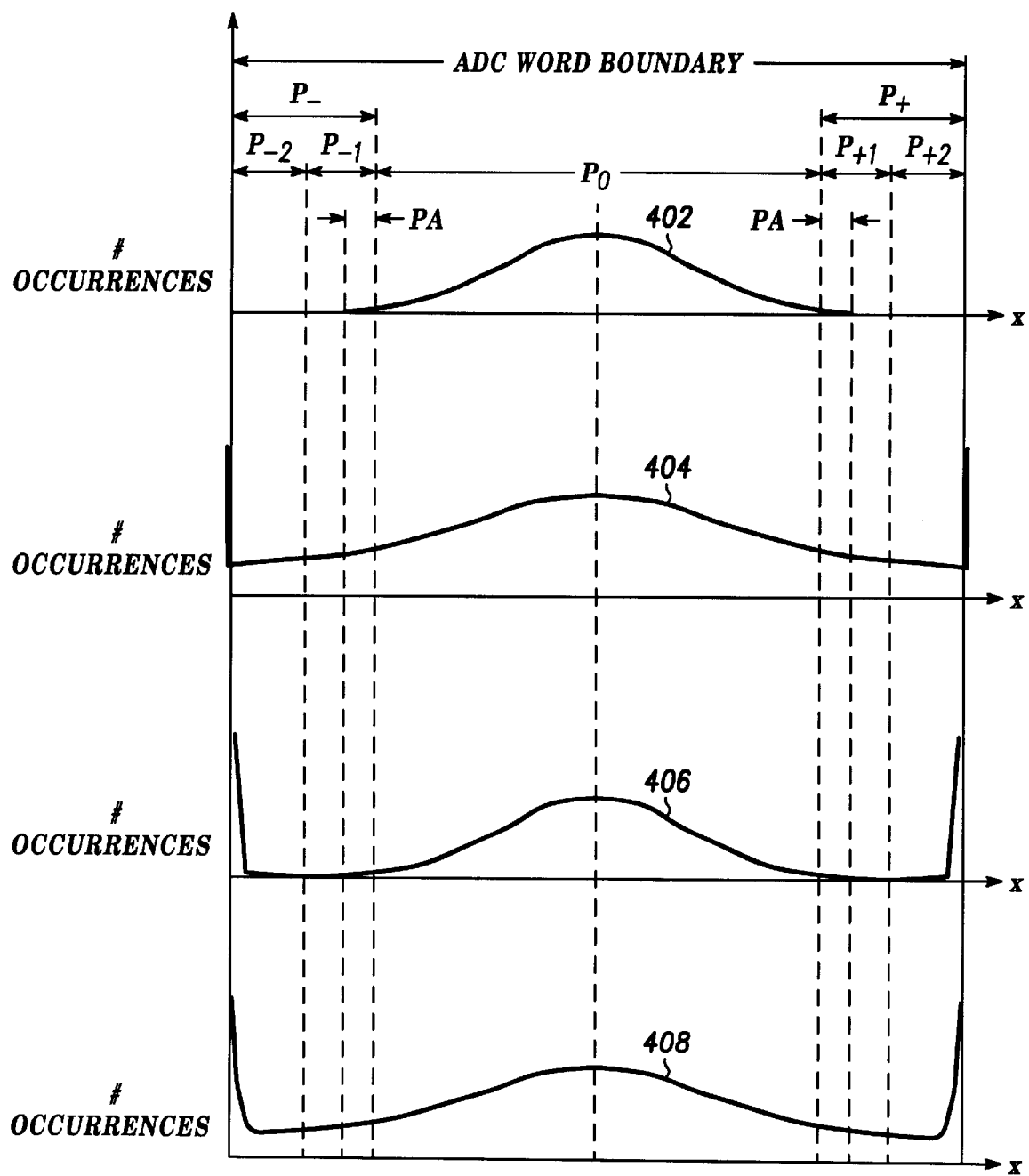
FIG. 4 illustrates a series of histograms for possible scenarios of analog-to-digital converter output code data sets for the direct down conversion receiver of FIG. 1.

FIG. 4 illustrates a series of histograms for possible scenarios of analog-to-digital converter output code data sets for the direct down conversion receiver of FIG. 1. The range of all possible analog-to-converter codes is defined as the ADC word boundary x. The analog-to-converter codes are partitioned into bins, preferably larger than the analog-to-digital's output code resolution. The bins are used to represent a relative percentage of energy across the range of possible analog-to-digital converter output codes x. For example, $P_O$ is defined as the Desired Operating Peak Code Bin, $P_A$ is defined as the Acceptable Operating Peak Code Bin, $P_{+/-1}$ is defined as the Upper/Lower Inner Quadrant Bins, $P_{+/-2}$ is defined as the Upper/Lower Outer Quadrant Bins, and $P_{+/-}$ is defined as the Upper/Lower summation of Upper/Lower Inner and Outer Quadrant Bins. These bin definitions are used for bin ratio analysis to evaluate the peaking performance of the analog-to-digital converter 114 as a function of time. In this example, five bins are used, however, other numbers of bins may be used to suit specific applications. $P_O$ and $P_A$ are well known in the art as a chosen subset of an analog-to-digital converter's operating point relative to the maximum analog-to-digital converter Word Boundaries. $P_O$ and $P_A$ are selected to ensure that the receiver will be capable of demodulating signals with a given bit error rate (BER) performance. The typical values of $P_O$ and $P_A$ are selected in the range of about 3 to 10 dB below the analog-to-digital converter's Word Boundary, however other values may be used to suit specific applications and the required BER performance. The additional bins $P_{+/-1}$ and $P_{+/-2}$ defining the histogram boundaries may be, for example, an evenly distributed split of the remaining analog-to-digital converter Word Boundary's bin space $P_{+/-}$ and may be defined as the range of analog-to-digital converter codes that lie outside the expected normal optimal operation bins of $P_O$ and $P_A$.

The following histograms are examples of typical analog-to-digital converter input data distributions that may be analyzed by histogram peaking identification methods of the present invention. A description of a histogram analysis method is presented for each of the analog-to-digital converter input data distributions.

Histogram 402 illustrates an analog-to-digital converter output code histogram for an optimized multi-channel analog-to-digital converter input load. Optimal $P_O$ and acceptable $P_A$ levels of clipping occur in this example, and all analog-to-digital converter output values x lie within the user defined acceptable operating peaking bin $P_A$. The calculation to determine if $P_A$ has been exceeded is performed within the Adaptation Algorithm block 560 of FIG. 5. In the Adaptation Algorithm block 560, each individual analog-to-digital converter output is compared to the all-inclusive analog-to-digital converter code data set x to determine the count of the number of peaks (#P) in step 522A that exist above the desired acceptable threshold $P_A$ and the count of the number of Non-Peaks (#NP) in step 522B that exist below the desired acceptable threshold $P_A$. Both counts #P in step 522A and #NP in step 522B are performed over the complete range of analog-to-digital converter output codes x as a function of time and is thus representative of analyzing a histogram as described above. The percentage of peaking events (%P) is then calculated in step 524 as the ratio of #P to #NP over the analog-to-digital converter output data range x. The percentage of peaking events (%P) is then compared to the percentage of acceptable peaking (%PA) in step 526 to determine whether or not an optimal or non-optimal ADC signal load is present. The percentage of acceptable peaking (%PA) is defined as a normalized ratio of acceptable analog-to-digital converter code outputs relative to the full-scale dynamic range of the analog-to-digital converter. For the general case of establishing a $P_A$ boundary of 3 dB, %PA=50%, since the absolute value of 10LOG(1/2) is 3 dB, which represents a 50% analog-to-digital converter load. In the case where %PA is larger than the calculated %P, the system is considered to be in a non-peaking environment and allowed to free run in step 534 and log a successful analysis window of time and its %P in step 536 as a record that may be analyzed later to allow for longer composite analysis times. This longer analysis window of time and of composite %P results can be used for statistical analysis of the communication link and thus may be used for further optimization and reliability based system design tradeoffs.

Histogram 404 illustrates multi-channel load clipping of the analog-to-digital converter. Multi-channel load clipping is ADC clipping that occurs through the application of desired system signals that periodically exceed the predefined $P_A$ threshold of the wideband analog-to-digital converter. In this example, the analog-to-digital converter input data is spread beyond the $P_A$ limit indicating that the analog-to-digital converter is operating in an overload condition. Note that the overall distribution of the histogram still resembles the same distribution shape as that of histogram 402 and is only limited by the analog-to-digital converter Word Boundary, where the highest number of samples occur. The bin corresponding to the Word Boundary is shown by heavy lines. The similarity of the histograms 404 and 402 distributions imply that the system gain prior to the analog-to-digital converter input is too high and should be adjusted to realign the gain to fit the analog-to-digital converter data within the $P_A$ limits. This condition can be quantitatively found by applying the Histogram Analysis Algorithm of FIG. 6 through step 626. Step 626 receives as input the raw analog-to-digital converter data output codes. From these codes, step 626 calculates $P_{OP}$ which is defined as the ratio of the optimal code bin occurrences $P_O$ to the summation of the undesired occurrence bins $P_{+/-}=P_{+/-1}+P_{+/-2}$ as defined above. The parsing of the values into the various bin types $P_A$, $P_O$, $P_{+/-}$, $P_{+/-1}$, and $P_{+/-2}$ has been performed in step 606, in which the raw analog-to-digital converter code values are collected and sorted according to their the bin definitions. This ratio is then saved in memory with the appropriate device settings for the lower frequency limit $f_L$, the upper frequency limit $f_{-f}$ and gain settings to be used for later analysis. The raw bin sorted analog-to-digital converter data is then passed to the $P_C$ bin ratio calculator in step 628 which calculates the ratio of $P_{+/-2}$ to $P_{+/-1}$. The resulting ratio $P_C$ may then be applied to comparison functions to determine the likelihood of what type of peaking may be present. If $P_C<<1$ as evaluated in step 630 then the analog-to-digital converter will appear to have a heavy distribution of analog-to-digital converter data in the $P_{+/-1}$ quadrant, which may imply that either a continuous wave (CW) signal 632 or some other peaking event is present. On the other hand, if $P_C>>1$ as calculated in step 628 and compared in 634, then we may infer that most of the energy present in the histogram is distributed in the outer quadrants $P_{+/-2}$ and is likely to be due to a Continuous-wave (CW) interference signal. Again, to quantify what type of peaking event is present so as to take appropriate action, the following additional calculations may be performed: 1) Examine the $P_{+2}$ bin corresponding to analog-to-digital converter Word Boundary's maximum output code and note the number of occurrences $B_{MAX2}$ of that code; 2) Examine the contiguous analog-to-digital converter bin $B_{MAX12}$ below the $B_{MAX2}$ bin; 3) Calculate the ratio of $B_{MAX2}$ to $B_{MAX12}$. If the ratio is close to unity, then the peaking event may be attributed to a Continuous-wave (CW) peaking event, because the Continuous-wave (CW) peaking is typically distributed over multiple contiguous codes at levels relatively close to the maximum number of occurrences in the $B_{MAX}$ bin. If the ratio is significantly greater than one, i.e. by a factor of two or more, then the peaking interference may be attributed to a multi-channel load with too much gain before the analog-to-digital converter's input and that the high number in the $B_{MAX}$ bin is actually due to the greater time spent above the analog-to-digital converter's Word Boundary. 4) This analysis can also be performed on the $P_{-2}$ quadrant and should produce comparable results. It should be noted that in this example, the extreme edges of the histogram 404 should have collected additional analog-to-digital converter codes in only the outer most two ADC Word Boundary bins and will have the appearance of an impulse function rather than the "tight" distribution that the Continuous-wave (CW) type peaking exhibits as shown in histogram 406. These differences between an impulse and a "tight" distribution are exploited in the above calculations to identify whether or not the peaking event is a Continuous-wave (CW) or a channel load issue.

Histogram 406 illustrates optimized on-channel load with clipping induced by Continuous-wave (CW) interference. In this example, the digital sample values of the multi-carrier input signal lie within the selected peaking threshold, however, ingress signals carrying Continuous-wave (CW) interference result in a range of digital sample values that increase in number near the full-scale input value of the analog-to-digital converter. Again, the histogram analysis described above may be performed to identify the most likely type of peaking interference.

Histogram 408 illustrates both on-channel load clipping and clipping induced by Continuous-wave (CW) interference. In this example, digital sample values exceed the selected peaking threshold and increase in number near the full-scale input value of the analog-to-digital converter. Again, the histogram analysis described above may be performed to identify the most likely type of peaking interference.

The peaking ratio is generated by counting the digital samples from the analog-to-digital converter into two bins, non-peaking samples and peaking samples. A peaking sample has a value equal to or greater than a selected peaking threshold, for example, about 3 dB below the full-scale value of the digital samples generated by the analog-to-digital converter. A non-peaking sample has a value below the selected peaking threshold. The two bins are then allowed to count samples over time. The peaking ratio may be calculated by dividing the contents of the peaking sample bin by the contents of the non-peaking sample bin. The peaking ratio is used to adjust the frequency response of the signal filter and the gain of the variable gain amplifier.

Figure 5:
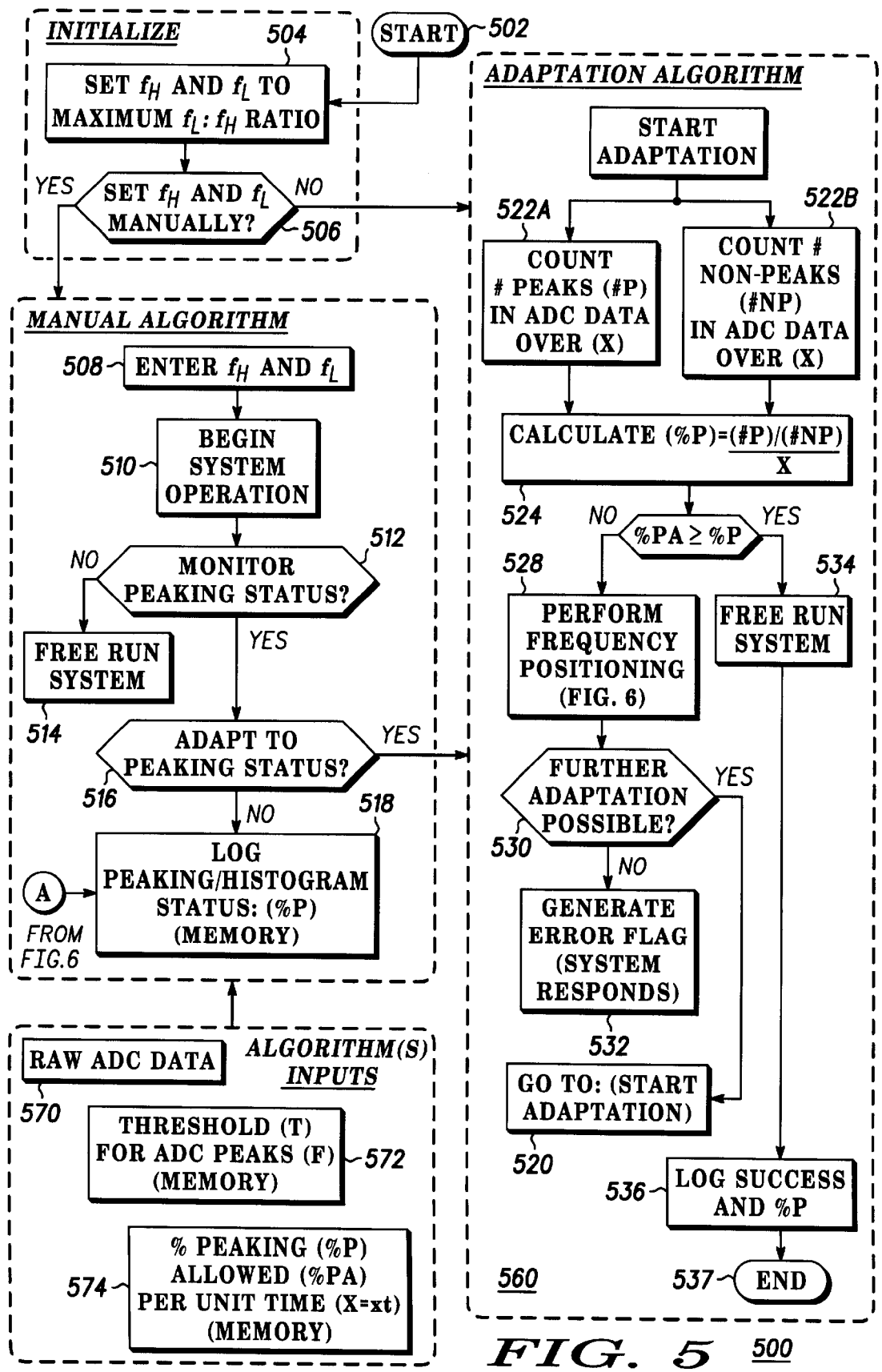
FIG. 5 illustrates a flowchart of a method for optimizing bandwidth of the analog-to-digital converter by analyzing the histograms of FIG. 4.

FIG. 5 illustrates a flowchart of a method for optimizing bandwidth of the analog-to-digital converter by analyzing the histograms of FIG. 4.

Step 502 is the entry point of the flowchart 500.

In step 504, the cutoff frequency of the lowpass filter 106 and the cutoff frequency of the highpass filter 108 are initialized to pass the entire system frequency range.

In step 506, if manual entry of cutoff frequencies is selected, control transfers to 508. Otherwise, control transfers to step 520.

In step 508, the values for the cutoff frequencies of the adjustable lowpass filter 106 and the adjustable highpass filter 108 are entered manually.

In step 510, the manually entered values are set and the analog-to-digital converter begins generating digital samples.

In step 512, if peaking status monitoring is selected, then control transfers to step 516. Otherwise, control transfers to step 514.

In step 514, analog-to-digital conversion continues at the manually entered filter cutoff frequencies.

In step 516, if automatic adaptation mode is selected, control transfers to step 520. Otherwise, control transfers to step 518.

In step 518, the raw analog-to-digital converter data is analyzed to measure a corresponding peaking ratio that is logged for each frequency band in the system frequency range. In a further embodiment, if the peaking ratio is greater than a selected peaking ratio threshold, then the manual mode may exit to the adaptation mode if desired. Alternatively, the system operator can observe excessive peaking to initiate the automatic mode. Step 518 also receives as inputs the raw analog-to-digital converter data 570, the selected peak threshold 572, and the allowable peaking per unit time 574.

Step 520 is the entry point for the automatic adaptation mode.

In step 522, the digital samples are counted into peaking and non-peaking bins as described in step 518.

In step 524, the peaking ratio is calculated by dividing the contents of the peaking bin by the non-peaking bin.

In step 526, if the peaking ratio is less than or equal to the selected peaking ratio threshold, then control transfers to 534. Otherwise, control transfers to step 528. In step 528, new cutoff frequencies are calculated and selected for the adjustable filters. An example of the calculation of the cutoff frequencies is described with reference to the flowchart 600 of FIG. 6.

In step 530, if peaking is still present when the adaptive filters have been set to their highest frequency selectivity at the minimum gain setting, then control transfers to step 532. Alternatively, the algorithm may be terminated manually. Otherwise, control transfers back to step 520.

In step 532, an error flag is generated that may be used to alert a higher level system response. The error flag is indicative that the frequency positioning adaptation algorithm is unable to converge to an acceptable peaking operating point. This implies that peaking is still present when the adaptive filters are at the highest frequency selectivity and the minimum gain setting has been reached such that further frequency selectivity and/or gain adjustments are not possible and it becomes necessary to alert a higher level system diagnostic to take further action.

In step 534, analog-to-digital conversion continues at the currently selected filter cutoff frequencies.

In step 536, a success flag is logged together with the peaking ratio calculated in step 524.

Step 537 is the exit point for the flowchart 500.

Figure 6:
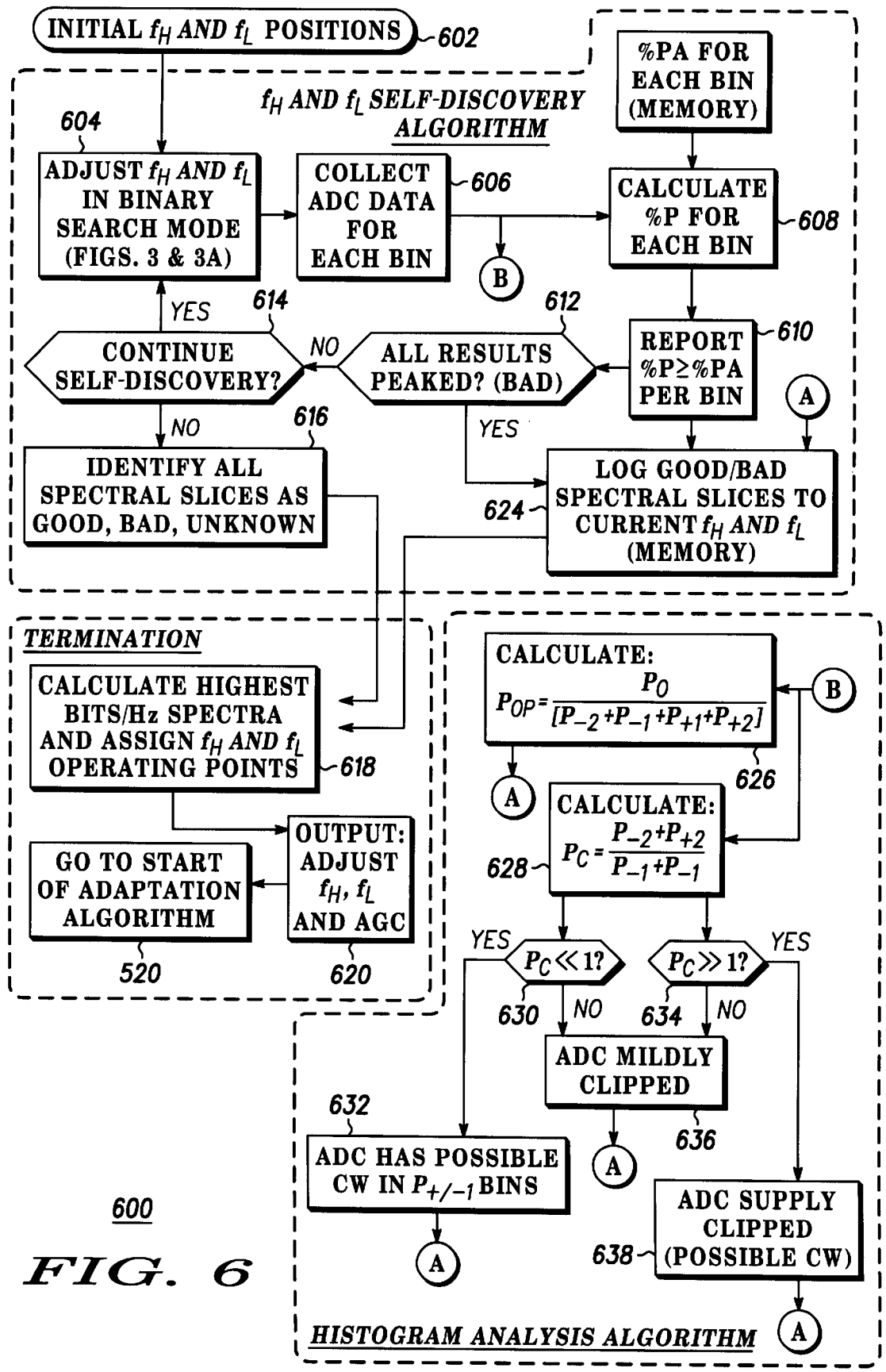
FIG. 6 illustrates a flowchart of a method of selecting cutoff frequencies for the adjustable filters for the flowchart of FIG. 5 including a method of histogram analysis of raw analog-to-digital data to quantify a systems peaking performance.

FIG. 6 illustrates a flowchart of a method of selecting cutoff frequencies for the adjustable filters for the flowchart of FIG. 5 including a method of histogram analysis of raw analog-to-digital data to quantify a systems peaking performance.

Step 602 is the entry point for the flowchart 600.

In step 604, the cutoff frequencies for the adjustable filters are selected by performing a binary search mode as described with reference to FIGS. 3 and 3A.

In step 606, digital samples are collected from the analog-to-digital converter and counted into bins for performing histogram analysis as described with reference to FIG. 4.

In step 608, the peaking ratio is calculated for each bin as described above with reference to step 524 and compared with a corresponding peaking ratio threshold for each bin.

In step 610, the peaking ratio for each bin is compared to the corresponding peaking ratio threshold.

In step 612, if all the peaking ratios exceed the corresponding peaking ratio thresholds, control transfers to step 624. Otherwise, control transfers to step 614.

In step 614, if continue self-discovery mode is selected, control transfers back to step 604. Otherwise, control transfers to step 616.

In step 616, each portion of the system frequency range is identified as "good" if the peaking ratio is less than the selected peaking ratio threshold, "bad" if peaking ratio is greater than or equal to the selected peaking ratio threshold, and "unknown" if no identification has been made to cover the case when the binary search algorithm has been requested to exit before completing the identification of all system spectral characteristics as they relate to the peaking environment. The "unknown" category is part of an all inclusive bookkeeping method for describing a portion of the system spectrum that presumes nothing and categorizes everything, and provides for a possible decision making process by a higher level controller.

In step 618, the highest bits/Hz spectra are calculated, and the upper and lower cutoff frequencies for the adjustable filters are then selected. The highest bits/Hz is a metric that couples signal to noise performance and spectral bandwidth for each of the noncontiguous available frequency bands found by the spectral binary search that can be used by a single analog-to-digital converter without excessive peaking. The highest bits/Hz is used to select the maximum throughput that a given bandwidth is capable of supporting. An example of a bits/Hz/signal to noise calculation would be to compare two noncontiguous spans of bandwidth that are separated by some peaking event that the analog-to-digital converter cannot use. Assuming that the bandwidth is the same and the supportable signal to noise is also the same, then no difference in bits/Hz efficiency is seen, and the bits/Hz throughput efficiency is also the same. Either spectral portion may therefore be used without sacrificing throughput performance. However, as a simple example of many possible scenarios, if one of the noncontiguous spans of bandwidth has a noise floor 3 dB higher than the other span, then the bits/Hz able to be supported by a modulated carrier is half the complexity. That is, 16QAM has sixteen unique symbols and 32QAM has thirty-two unique symbols, therefore the 32QAM constellation has twice the complexity and information in the same spectral space as the 16QAM constellation for the same level of bit error rate (BER) performance. In this case, the communication channel of choice would be the spectral portion with the lower noise floor that can support twice the throughput.

In step 620, the selected cutoff frequencies are set on the adjustable filters, and the gain is selected for the variable gain amplifier. Control then transfers via step 622 back to the automatic adaptation mode at step 520 in FIG. 5 to perform the spectral peaking check and verify that the spectra are usable via steps 522, 524, 526, 534, 536, and 537.

In step 622, control transfers back to the automatic adaptation mode at step 520.

In step 624, the "good" and "bad" spectral slices are logged for the currently selected cutoff frequencies of the adjustable filters, and control transfers to step 618.

In step 626, $P_{OP}$ is calculated from the bin counts from step 606 and logged at step 624. $P_{OP}$ is another possible path than the Adaptation Algorithm of FIG. 5 that allows the collection of peaking performance over time while not necessarily stipulating that the frequency and/or gain adjustments be used to take corrective action other than logging the $P_{OP}$ results for later analysis.

In step 628, the clipping coefficient $P_C$ is calculated from the histogram data illustrated in FIG. 4 as explained above according to the formula:

$$P_C \approx \{P_{-2} + P_{2}\} / \{P_{-1} + P_{+1}\}$$

In step 630, if the clipping coefficient $P_C$ is much less than one, then control transfers to step 632. Otherwise, control transfers to step 636.

In step 632, possible clipping due to Continuous-wave (CW) ingress signals may be present in the $P_{\pm 1}$ bins and control transfers to step 624.

In step 634, if the clipping coefficient $P_C$ is much greater than 1, then control transfers to step 638. Otherwise, control transfers to step 636.

In step 636, mild clipping is indicated and control transfers to step 624.

In step 638, severe clipping is indicated and control transfers to step 624.

As an alternative to the signal filter comprising adjustable lowpass and highpass filters connected in series and the method for selecting cutoff frequencies described above, a signal filter having a selectable frequency response may be made by connecting a plurality of bandpass filters in parallel. Each of the bandpass filters has a selectable gain used to control the frequency response of the bandpass filters across the system frequency range.

Figure 7:
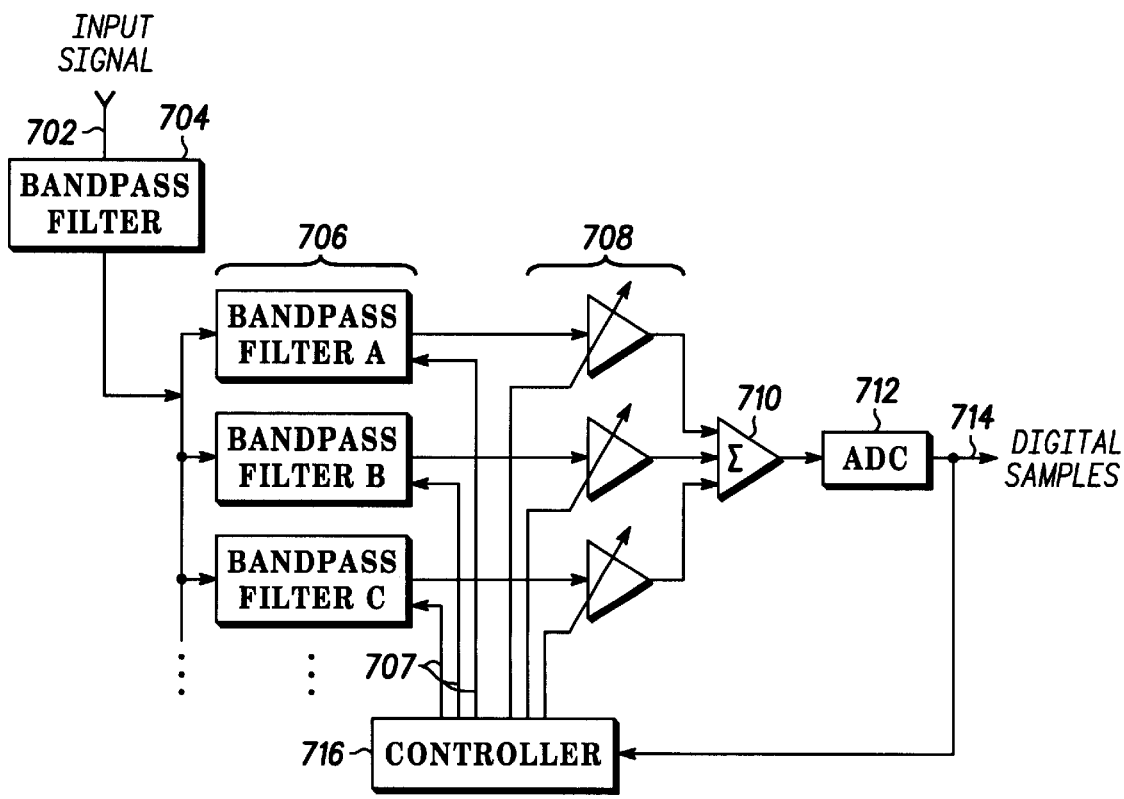
FIG. 7 illustrates a block diagram of a wideband analog-to-digital converter with optimized dynamic range incorporating parallel bandpass filters according to an embodiment of the present invention.

FIG. 7 illustrates a block diagram of a wideband analog-to-digital converter with optimized dynamic range incorporating parallel bandpass filters according to an embodiment of the present invention. Shown in FIG. 7 are a signal input 702, a series bandpass filter 704, parallel bandpass filters 706, variable gain amplifiers 708, a summing amplifier 710, an analog-to-digital converter 712, a digital sample output 714, and a controller 716. The bandpass filters 704 and 706, the amplifiers 708 and 710, and the analog-to-digital converter 712 are well known and widely available components.

In the arrangement of FIG. 7, an input signal introduced at the signal input 702 is bandpass filtered to remove out-of-band signals by the series bandpass filter 704. The bandpassed signal from the series bandpass filter 704 is received as input by each of the parallel bandpass filters 706. The parallel bandpass filters 706 may be, for example, a comb filter. The bandwidth of each of the parallel bandpass filters 706 may be selected to suit specific applications and part count constraints. The parallel bandpass filters preferably have contiguous frequency bands to provide complete coverage across the system frequency range.

The outputs of the parallel bandpass filters 706 are amplified respectively by the variable gain amplifiers 708. Each of the variable gain amplifiers 708 has a separate gain control for selecting the gain of the corresponding parallel bandpass filter 706. In a further embodiment, the parallel bandpass filters 706 include a frequency control 707 for selecting the upper and lower frequency limits of the bandpass filter. The frequency control 707 may be implemented, for example, to reduce the number of bandpass filters required to cover a wide frequency range. For example, if a large frequency range of the input signal has little variation in peak amplitudes, then a single bandpass filter may be used to cover the large frequency range instead of using several bandpass filters in a comb filter arrangement.

The summing amplifier 710 sums the outputs of the variable gain amplifiers 708, and the sum is received as input by the analog-to-digital converter 712. The summing amplifier 710 may include a scale factor that normalizes the summed signal proportional to the number of variable gain amplifiers 708. The analog-to-digital converter 712 receives the summed signal from the summing amplifier 710 and generates the digital samples 714.

The controller 716 receives as input the digital samples 714 and adjusts the gain of each of the variable gain amplifiers 708. An example of a method for selecting the gain of each of the variable gain amplifiers 708 that may be implemented by the controller 716 is illustrated in FIG. 8.

Figure 8:
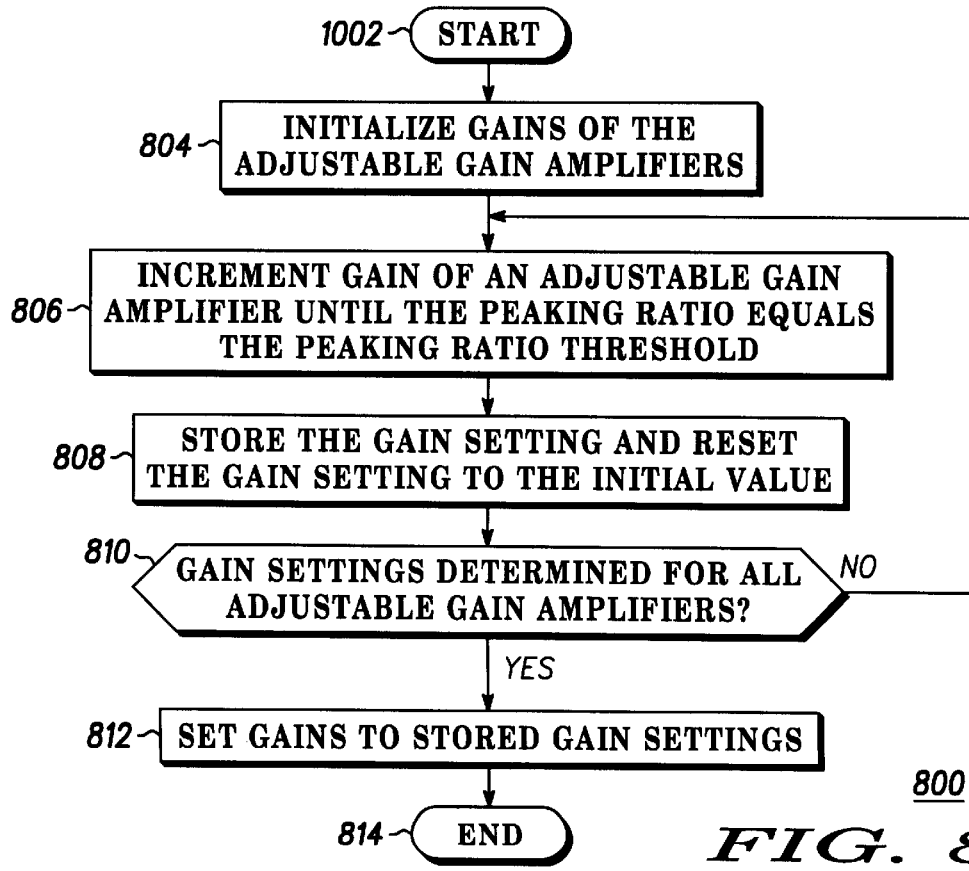
FIG. 8 illustrates a flowchart of a method for selecting the gain of each of the parallel bandpass filters of FIG. 7.

FIG. 8 illustrates a flowchart 800 of a method for selecting the gain of each of the parallel bandpass filters according to an embodiment of the present invention.

Step 802 is the entry point for the flowchart 800.

In step 804, the gains of the variable gain amplifiers 708 are set to an initial value of zero or some other convenient value.

In step 806, the gain of one of the variable gain amplifiers 708 is incrementally increased. For each gain setting, the peaking ratio is calculated from the digital samples as described above. The gain setting is increased until the peaking ratio equals the selected peaking ratio threshold. A separate selected peaking ratio threshold may be used to calculate the peaking ratio for each of the variable gain amplifiers 708 if desired to suit specific applications.

In step 808, the gain setting corresponding to the selected peaking ratio threshold is stored and the gain is reset to the initial value.

In step 810, if the gain settings have been determined for all of the variable gain amplifiers 708, control transfers to step 812. Otherwise, control transfers to step 806.

In step 812, the gain settings of each of the variable gain amplifiers 708 are set to the corresponding stored value. The resulting output of the summing amplifier 710 then has a peaking ratio approximately equal to the selected peaking ratio threshold for the current CATV plant conditions.

Step 814 is the exit point for the flowchart 800.

In a further embodiment of the present invention, a signal filter is made by connecting in series a plurality of bandstop filters to suppress the frequency response in portions of the system frequency range that would otherwise cause clipping at the output of the analog-to-digital converter. In contrast to bandpass filters that pass only a selected band of frequencies, bandstop filters pass all except a selected band of frequencies. Like bandpass filters, however, bandstop filters may be made from a lowpass filter and a highpass filter connected in series. A bandstop filter may therefore be configured as a bandpass filter simply by adjusting the cutoff frequencies so that the passbands of the lowpass filter and the highpass filter overlap.

Figure 9:
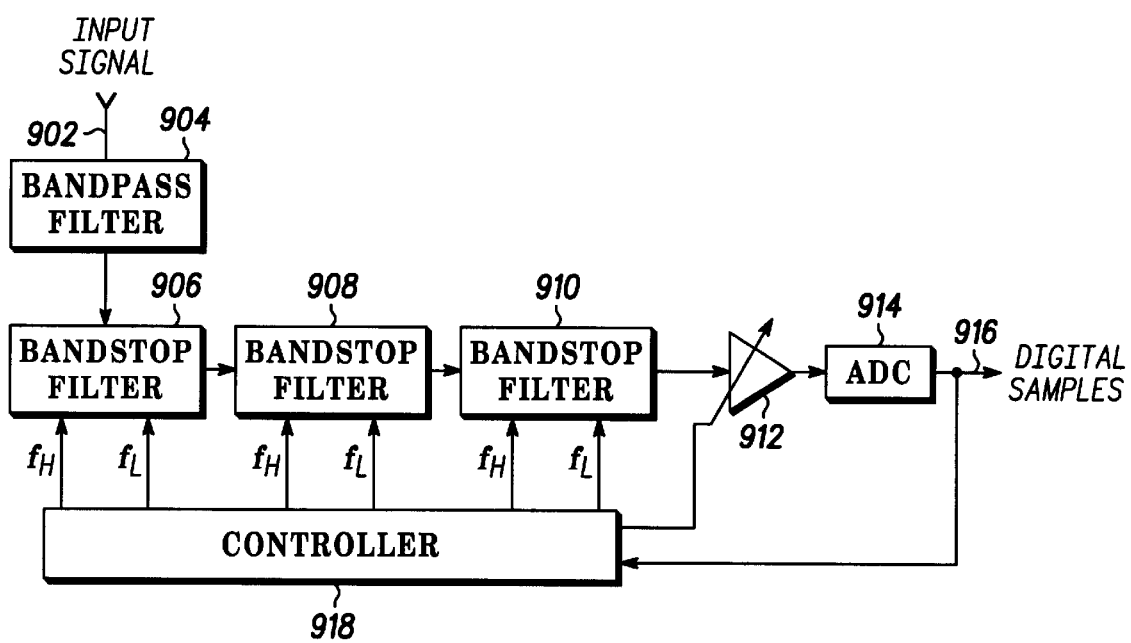
FIG. 9 illustrates a block diagram of a wideband analog-to-digital converter incorporating series bandstop filters according to a further embodiment of the present invention.

FIG. 9 illustrates a block diagram of a wideband analog-to-digital converter incorporating series bandstop filters according to a further embodiment of the present invention. Shown in FIG. 9 are a signal input 902, a series bandpass filter 904, series bandstop filters 906, 908, and 910, a variable gain amplifier 912, an analog-to-digital converter 914, a digital sample output 916, and a controller 918. The series bandpass filter 904, the bandstop filters 906, 908, and 910, the variable gain amplifier 912, and the analog-to-digital converter 914 are well known and widely available components. In this example, three bandstop filters are illustrated, however, a different number of bandstop filters may be used to suit specific applications.

In the arrangement of FIG. 9, an input signal introduced at the signal input 902 is bandpass filtered to remove out-of-band signals by the series bandpass filter 904. The bandpassed signal generated by the series bandpass filter 904 is received as input by the series bandstop filters 906, 908, and 910. Each of the series bandstop filters 906, 908, and 910 may be made from, for example, an adjustable lowpass and an adjustable highpass filter as described with reference to FIG. 7. The output of the series bandstop filter 910 is amplified by the variable gain amplifier 912. The analog-to-digital converter 914 generates the digital samples 916.

The controller 918 receives as input the digital samples 916 and adjusts the bandstop frequency of each of the series bandstop filters 906, 908, and 910. An example of a method for selecting the bandstop frequency of each of the series bandstop filters 906, 908, and 910 that may be implemented by the controller 918 is illustrated by the flowchart of FIG. 10.

Figure 10:
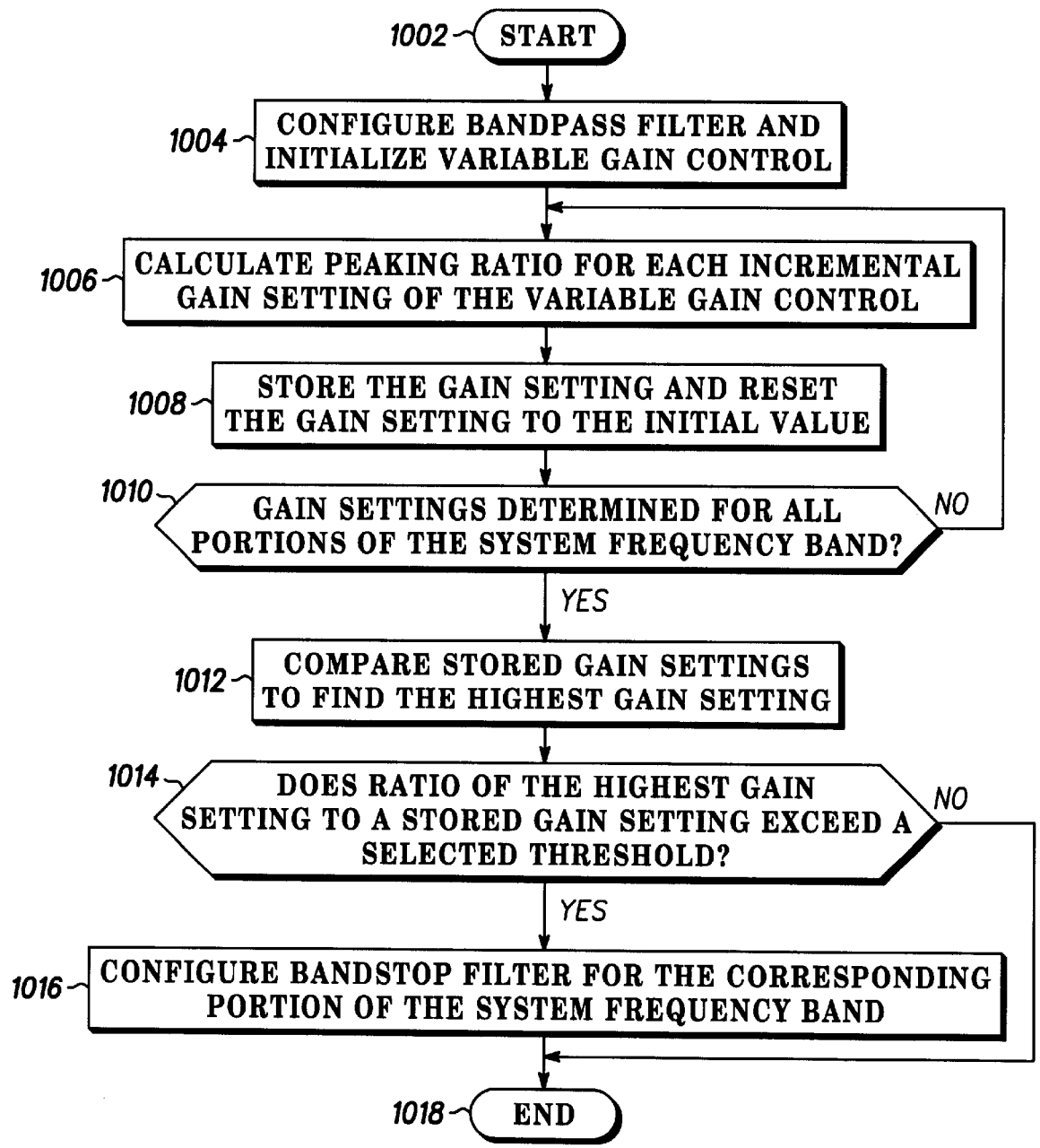
FIG. 10 illustrates a flowchart of a method for selecting the bandstop frequency of each of the series bandstop filters of FIG. 9 according to an embodiment of the present invention.

FIG. 10 illustrates a flowchart 1000 of a method for selecting the bandstop frequency of each of the series bandstop filters 906, 908, and 910 of FIG. 9 according to an embodiment of the present invention.

Step 1002 is the entry point for the flowchart 1000.

In step 1004, the series bandstop filters 906, 908, and 910 are configured as a bandpass filter to pass a portion of the system frequency range, and the gain of the variable gain amplifier 912 is set to an initial value of zero or some other convenient value. For example, each of the series bandstop filters 906, 908, and 910 may be configured as a bandpass filter having a bandwidth of one-tenth of the system frequency range and a lower cutoff frequency starting from the low end of the system frequency range.

In step 1006, the peaking ratio is calculated from the digital samples as described above as the gain of the variable gain amplifier is incrementally increased. For each gain setting, the peaking ratio is calculated from the digital samples as described above until the selected peaking ratio threshold is reached. A separate selected peaking ratio threshold may be used to calculate the peaking ratio for each portion of the system frequency range if desired to suit specific applications.

In step 1008, the gain setting of the variable gain amplifier corresponding to the selected peaking ratio threshold is stored, the gain is reset to the initial value, and the cutoff frequencies of the series bandstop filters 906, 908, and 910 are adjusted to the pass the next adjacent portion of the system frequency range.

In step 1010, if the gain settings of the variable gain amplifier 912 corresponding to the selected peaking ratio threshold have been determined over the entire system frequency band, control transfers to step 1012. Otherwise, control transfers to step 1006.

In step 1012, each of the stored gain settings of the variable gain amplifier 912 is compared to find the highest stored gain setting, which corresponds to the portion of the system frequency band having the lowest signal level.

In step 1014, if the ratio of the highest stored gain setting to any of the other stored gain settings exceeds a selected threshold, for example, 10 dB, then control transfers to step 1016. Otherwise, control transfers to step 1018.

In step 1016, one of the bandstop filters is configured as a bandstop filter for the corresponding portion of the system frequency bond. Each portion of the system frequency band containing a signal that could cause clipping may thus be prevented from reaching the analog-to-digital converter 914. Any unused bandstop filters may be configured, for example, as bandpass filters similar to the series bandpass filter 904. The variable gain amplifier 912 is then set to the lowest remaining stored gain setting. The output of the variable gain amplifier 912 then has a peaking ratio approximately equal to the selected peaking ratio threshold for the current plant conditions.

Step 1018 is the exit point for the flowchart 1000.

The wideband analog-to-digital converter with optimized dynamic range described above may be replicated with the same hardware design and controller functions already implemented throughout a cable television plant and can adapt automatically to changing requirements and conditions across multiple cable television plants.

Although the flowchart examples described above have been shown with reference to specific steps performed in a specific order, these steps may be combined, sub-divided, or reordered in other embodiments without departing from the scope of the claims. Unless specifically indicated herein, the order and grouping of steps is not a limitation of the present invention.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. An apparatus comprising:
   a signal filter for coupling to a received signal to generate a filtered signal wherein the signal filter has a selectable response as a function of frequency of the received signal;
   an analog-to-digital converter coupled to the signal filter for generating a series of digital samples representative of the filtered signal; and
   a controller coupled to the analog-to-digital converter for measuring a corresponding peaking ratio of the filtered signal from the series of digital samples in each of a plurality of frequency bands and for selecting the response of the signal filter as a function of the peaking ratio.

2. The apparatus of claim 1 wherein the peaking ratio is substantially equal to a number of the digital samples exceeding a selected peaking threshold divided by a number of the digital samples not exceeding the selected peaking threshold over a period of time.

3. The apparatus of claim 1 wherein the selected peaking threshold is 3 dB below a full-scale value of the digital samples.

4. The apparatus of claim 1 wherein the signal filter comprises an adjustable lowpass filter and an adjustable highpass filter connected in series.

5. The apparatus of claim 1 wherein the signal filter comprises a plurality of bandpass filters connected in parallel.

6. The apparatus of claim 5 further comprising a plurality of variable gain amplifiers coupled respectively to the plurality of bandpass filters.

7. The apparatus of claim 6 further comprising a summing amplifier coupled to an output of each of the plurality of variable gain amplifiers.

8. The apparatus of claim 5 wherein each of the plurality of bandpass filters has a selectable upper cutoff frequency and a selectable lower cutoff frequency.

9. The apparatus of claim 1 wherein the signal filter comprises a plurality of adjustable bandstop filters connected in series.

10. The apparatus of claim 1 further comprising a variable gain amplifier coupled to the signal filter.

11. The apparatus of claim 1 further comprising a direct digital conversion processor coupled to the analog-to-digital converter.

12. The apparatus of claim 1 further comprising a demodulator coupled to the direct digital conversion processor.

13. A method comprising:
   generating a filtered signal from a received signal according to a selectable frequency response;
   generating a series of digital samples representative of the filtered signal;
   measuring a corresponding peaking ratio of the filtered signal in each of a plurality of frequency bands from the series of digital samples; and
   selecting the frequency response as a function of the corresponding peaking ratio.

14. The method of claim 13 wherein the peaking ratio is substantially equal to a number of the digital samples exceeding a selected peaking threshold divided by a number of the digital samples not exceeding the selected peaking threshold over a period of time.

15. The method of claim 13 wherein the selected peaking threshold is 3 dB below a full-scale value of the digital samples.

16. The method of claim 13 wherein generating a filtered signal comprises lowpass filtering and highpass filtering.

17. The method of claim 13 wherein generating a filtered signal comprises parallel bandpass filtering.

18. The method of claim 13 wherein generating a filtered signal comprises bandstop filtering.

19. The method of claim 13 wherein measuring a corresponding peaking ratio comprises generating a histogram of the series of digital samples.

20. The method of claim 19 further comprising analyzing a sample distribution of the histogram to determine whether the filtered signal represents an optimal signal load.

21. The method of claim 19 further comprising analyzing a sample distribution of the histogram to determine whether multi-channel load clipping occurs.

22. The method of claim 19 further comprising analyzing a sample distribution of the histogram to determine whether optimized on-channel load with clipping induced by Continuous-wave (CW) interference occurs.

23. The method of claim 19 further comprising analyzing a sample distribution of the histogram to determine whether both on-channel load clipping and clipping induced by Continuous-wave (CW) interference occurs.

24. The method of claim 13 further comprising comparing the peaking ratio to a selected peaking ratio threshold.

25. The method of claim 24 wherein the frequency response is selected to achieve a peaking ratio of the filtered signal that is approximately equal to the selected peaking ratio threshold.

26. The method of claim 13 wherein measuring a corresponding peaking ratio comprises performing a histogram analysis to determine a clipping coefficient.

27. The method of claim 26 wherein the clipping coefficient is calculated substantially according to the formula:

$$P_C = \frac{P_{-2} + P_{+2}}{P_{-1} + P_{+1}}$$

where $P_C$ is the clipping coefficient, $P_{+1}$ and $P_{-1}$ are the Upper/Lower Inner Quadrant Bins respectively, and $P_{+2}$ and $P_{-2}$ are the Upper/Lower Outer Quadrant Bins, respectively.

28. The method of claim 13 wherein selecting a frequency response comprises calculating highest bits/Hz spectra and assigning upper and lower cutoff frequencies for the frequency response.

29. The method of claim 13 wherein selecting a frequency response comprises adjusting a gain of the received signal.

30. The method of claim 13 further comprising:
initializing a gain of at least one variable gain amplifier; and
incrementing the gain of the at least one variable gain amplifier so that the corresponding peaking ratio is substantially equal to a selected peaking ratio threshold.

31. The method of claim 13 further comprising:
configuring the selectable frequency response as a bandpass filter for one of the plurality of frequency bands;
initializing an incremental gain of at least one variable gain amplifier;
calculating a peaking ratio for each incremental gain of the at least one variable gain amplifier to find a highest gain setting corresponding to a selected peaking ratio threshold for each of the plurality of frequency bands; and
configuring the bandpass filter as a bandstop filter at one of the plurality of frequency bands if the highest gain setting exceeds a selected gain threshold.

* * * * *